United States Patent
Ifis

(10) Patent No.: US 12,009,315 B2
(45) Date of Patent: Jun. 11, 2024

(54) COMPONENT CARRIER STRUCTURE CONNECTABLE BY ELECTRICALLY CONDUCTIVE CONNECTION MEDIUM IN RECESS WITH CAVITY HAVING SURFACE PROFILE

(71) Applicant: AT&S Austria Technologie & Systemtechnik Aktiengesellschaft, Leoben (AT)

(72) Inventor: Abderrazzaq Ifis, Leoben (AT)

(73) Assignee: AT&S Austria Technologie & Systemtechnik AG, Leoben (AT)

( * ) Notice: Subject to any disclaimer, the term of this patent is extended or adjusted under 35 U.S.C. 154(b) by 376 days.

(21) Appl. No.: 16/948,106

(22) Filed: Sep. 3, 2020

(65) Prior Publication Data
US 2022/0068838 A1    Mar. 3, 2022

(51) Int. Cl.
H01L 23/498    (2006.01)
H01L 21/48     (2006.01)
H01L 23/00     (2006.01)

(52) U.S. Cl.
CPC ........ H01L 23/562 (2013.01); H01L 21/4857 (2013.01); H01L 21/4867 (2013.01); H01L 23/49822 (2013.01); H01L 23/49838 (2013.01); H01L 23/49883 (2013.01)

(58) Field of Classification Search
CPC ............ H01L 21/4857; H01L 21/4867; H01L 23/49883; H01L 23/49811; H05K 2201/09745
See application file for complete search history.

(56) References Cited

U.S. PATENT DOCUMENTS

| | | | | |
|---|---|---|---|---|
| 6,098,282 A | * | 8/2000 | Frankeny | H05K 1/162 29/25.42 |
| 9,786,849 B2 | * | 10/2017 | Guimard | H01L 51/5212 |
| 10,811,348 B2 | * | 10/2020 | Kobayashi | H01L 23/49866 |

(Continued)

FOREIGN PATENT DOCUMENTS

| | | |
|---|---|---|
| JP | H11112146 A | 4/1999 |
| JP | 2003163452 A | 6/2003 |
| JP | 2019021681 A | 2/2019 |

OTHER PUBLICATIONS

Office Action in Application No. 202111027027.6; pp. 1-6; Feb. 8, 2024; China National Intellectual Property Administration; No. 6, Xitucheng Lu, Jimenqiao Haidian District, Beijing City, 100088, China.

*Primary Examiner* — Phat X Cao
(74) *Attorney, Agent, or Firm* — Robert A. Blaha; Smith Tempel Blaha LLC

(57) ABSTRACT

A component carrier with a first component carrier structure including a first stack which has at least one first electrically conductive layer structure and at least one first electrically insulating layer structure is disclosed. The at least one first electrically conductive layer structure has a first contact element which extends up to a first contact surface of the first stack. An electrically conductive connection medium is directly connected to the first contact element at the first contact surface by filling at least one recess of the first contact element. The at least one recess having a larger dimensioned cavity delimited by a smaller dimensioned surface profile.

16 Claims, 3 Drawing Sheets

(56) References Cited

U.S. PATENT DOCUMENTS

| | | | |
|---|---|---|---|
| 2002/0056890 A1* | 5/2002 | Advocate, Jr. | ....... H05K 3/0035 257/E23.145 |
| 2005/0067679 A1 | 3/2005 | Leong et al. | |
| 2020/0253054 A1 | 8/2020 | Tuominen | |

* cited by examiner

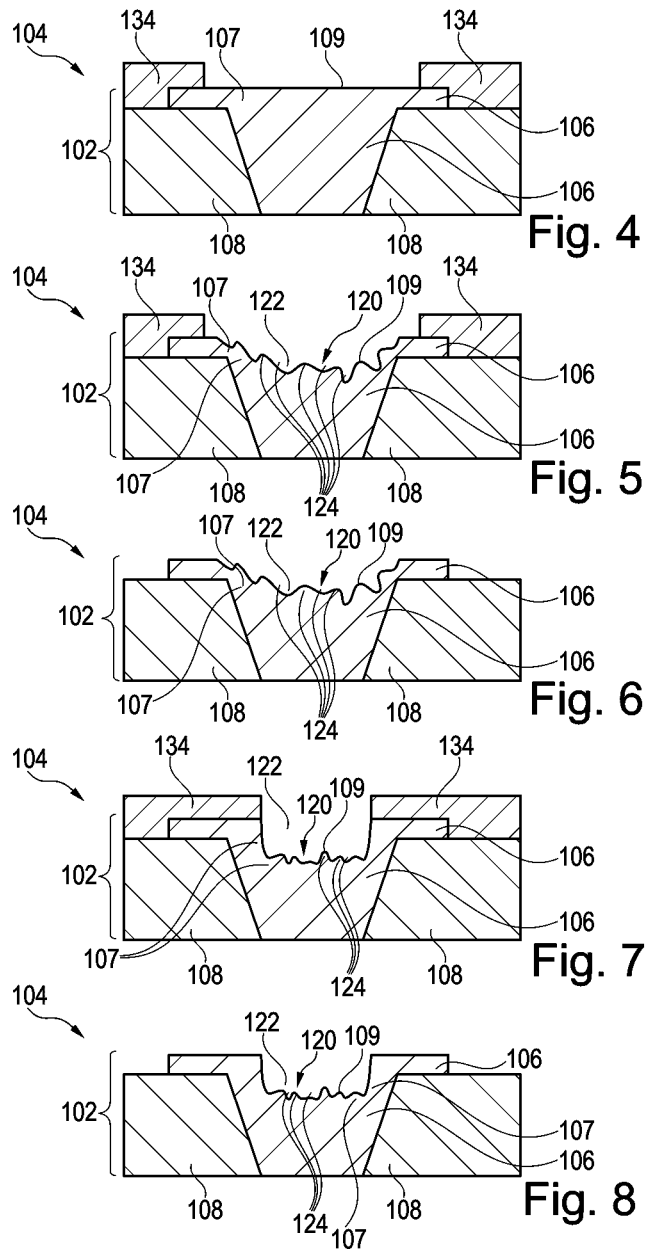

COMPONENT CARRIER STRUCTURE CONNECTABLE BY ELECTRICALLY CONDUCTIVE CONNECTION MEDIUM IN RECESS WITH CAVITY HAVING SURFACE PROFILE

TECHNICAL FIELD

The invention relates to a component carrier. Furthermore, the invention relates to a method of manufacturing a component carrier.

TECHNOLOGICAL BACKGROUND

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

A shortcoming with laminated component carriers is that they may be prone to delamination, warpage and/or other phenomena which may deteriorate the reliability of the component carrier.

SUMMARY

There may be a need for a simply manufacturable component carrier with high reliability.

According to an exemplary embodiment, a component carrier is provided which comprises a first component carrier structure comprising a first stack which comprises at least one first electrically conductive layer structure and at least one first electrically insulating layer structure, wherein the at least one first electrically conductive layer structure has a first contact element which extends up to a first contact surface of the first stack, and an electrically conductive connection medium directly connected to the first contact element at the first contact surface by filling at least one recess of the first contact element, the at least one recess comprising a larger dimensioned cavity delimited by a smaller dimensioned surface profile.

According to another exemplary embodiment, a method of manufacturing a component carrier is provided, wherein the method comprises forming a first component carrier structure comprising a first stack which comprises at least one first electrically conductive layer structure and at least one first electrically insulating layer structure, wherein the at least one first electrically conductive layer structure has a first contact element which extends up to a first contact surface of the first stack, and directly connecting the first contact element at the first contact surface to an electrically conductive connection medium by filling at least one recess of the first contact element with the electrically conductive connection medium, the at least one recess comprising a larger dimensioned cavity delimited by a smaller dimensioned surface profile.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "component carrier structure" may particularly denote a sheet or plate handled and processed during manufacturing component carriers, for instance a stacked layer sequence, a panel, or an array. It is also possible that a component carrier structure may be a printed circuit board (PCBs) or sub-stack of a printed circuit board to be created. In particular, a component carrier may be manufactured by interconnecting a plurality of component carrier structures.

In the context of the present application, the term "stack" may particularly denote an arrangement of multiple planar layer structures which are mounted in parallel on top of one another. The layer structures of the stack may be connected by lamination, i.e. the application of heat and/or pressure.

In the context of the present application, the term "layer structure" may particularly denote a continuous layer, a patterned layer, or a plurality of non-consecutive islands within a common plane.

In the context of the present application, the term "contact surface" may particularly denote a main surface of a component carrier structure, and in particular of at least one contact element thereof, at which the component carrier structure is to be connected to a corresponding contact surface of a further body (such as another component carrier structure or a component), and in particular of at least one further contact element thereof.

In the context of the present application, the term "contact element" may particularly denote a portion of at least one electrically conductive layer structure of a stack of a component carrier structure, which portion is exposed at a stack surface to be suitable for establishing an electrically conductive connection with another contact element by means of an electrically conductive connection medium in between.

In the context of the present application, the term "recess" may particularly denote any hollow volume, indentation or blind hole at a contact surface portion of an electrically conductive contact element.

In the context of the present application, the term "larger dimensioned cavity delimited by a smaller dimensioned surface profile" may particularly denote (i) that the cavity has larger structural dimensions (such as depth and width of the cavity) than smaller structures (such as widths and top to bottom distances of alternating protrusions and indentations of the surface profile) defining the surface profile. It may further mean (ii) that structural or spatial limits of the cavity are defined by the surface profile, so that walls of the cavity have the surface profile. While the cavity may mainly define shape and size of the recess, the surface profile may add to the borders of the cavity a wave structure, oscillations, undulations, pronounced roughness or unevenness, which may be superposed or modulated onto the cavity. The surface profile may be a regular surface profile with a repeated sequence of indentations and protrusions having a defined width and height. Alternatively, the surface profile may be an irregular surface profile with a random or non-ordered sequence of indentations and protrusions having varying values of width and height. In particular, the cavity may be concavely shaped. The surface profile may be a sequence of small hills and valleys alternating along a curved surface delimiting the cavity. In particular, the cavity may be a hollow space with a volume or defined by characteristic dimensions being larger than (in particular being at least twice of, more particularly being at least three times of) hollow volumes or characteristic dimensions of structures of the surface profile.

According to an exemplary embodiment, a component carrier is provided which comprises a stack-type component carrier structure with proper adhesion and a reliable electric connectivity at a connection interface between the component carrier structure and a further body (such as a further component carrier structure or a component). This may be accomplished by an electrically conductive connection medium, such as a metallic paste, bridging a hollow space between the electrically conductive contact element of the component carrier structure exposed at its contact surface and said body. Highly advantageously, one or both of opposing contact surfaces of the contact element and the further body may be provided with a recess defined by a hollow (more macroscopic) cavity delimited by a (more microscopic) surface profile of pronounced unevenness. During interconnection of the component carrier structure and the further body, said one or more recesses may be filled with the electrically conductive connection medium to thereby establish a reliable electric coupling and a strong mechanical connection between the component carrier structure and the body. Advantageously, the component carrier may be rendered significantly more robust against shear forces tending to promote a mutual lateral motion of the interconnected component carrier structure and further body. Thus, any tendency of delamination of constituents of the component carrier may be strongly suppressed. Descriptively speaking, the described geometry of the recess(es) may be denoted as a strongly roughed dimple which improves the connection strength of the component carrier as a whole.

Next, the mentioned effect related to shear forces will be described in more detail based on an example related to lateral via alignment between the component carrier structure and the body being embodied as a further component carrier structure (see for instance FIG. 1 and FIG. 1A): It is highly advantageous that two opposing vias are properly aligned in order to avoid loss of via-via connections. Shear-stress induced slippage of the two stacks may lead to misaligned vias, which may affect the transport of current and/or signals. This issue may occur in particular during lamination and may describe the slipping of the connection surfaces of opposing stacks (or the like) towards each other. Consequently, vias may be conventionally improperly aligned and different layers may lose their interconnection. Thanks to the provision of the cavity (which may be preferably round), stress concentration may be avoided and alignment may be improved.

Hence, an exemplary embodiment of the invention provides a rough dimple at a connection interface of a component carrier structure to be filled with an electrically conductive filling medium for establishing a reliable and short-path z-interconnection between the component carrier structure and said further body. In particular, the creation of a roughed via pad surface may be advantageous, and may be established for example by etching using a photomask. Advantageously, a highly reliable adhesion between copper pads and conductive paste may thus be created. Descriptively speaking, the rough dimple may define an inverse geometry for an encapsulation of conductive paste, or other kinds of electrically conductive connection medium.

In the following, further exemplary embodiments of the component carrier and the method will be explained.

In an embodiment, the component carrier comprises a further body, wherein the electrically conductive connection medium directly connects the first contact element at the first contact surface with the further body by filling at least one recess of the first contact element and optionally of the further body. Correspondingly, the method may comprise directly connecting the first contact element at the first contact surface with the further body by filling at least one recess of the first contact element and optionally of the further body with the electrically conductive connection medium.

In an embodiment, the further body is a second component carrier structure comprising a second stack which comprises at least one second electrically conductive layer structure and at least one second electrically insulating layer structure, wherein the at least one second electrically conductive layer structure has a second contact element which extends up to a second contact surface of the second stack. The electrically conductive connection medium may directly connect the first contact element at the first contact surface with the second contact element at the second contact surface by filling the at least one recess of the first contact element and optionally of the second contact element (compare for example FIG. 1 and FIG. 1A). In the context of the present application, the term "electrically conductive connection medium directly connecting contact elements" may particularly denote that only or substantially only said electrically conductive connection medium (such as a metallic paste) fills a space between opposing contact surface areas of the contact elements. For instance, two printed circuit boards (PCBs) may be reliably connected in the described fashion without the risk of delamination triggered by shear forces.

In another embodiment, the further body comprises a component (compare for example FIG. 9). For instance, a heat sink or a chip may be connected as such a component to a component carrier structure such as a PCB. Hence, also a connection between a component and a component carrier structure may be established in the described way. By such a configuration, the component may be surface mounted on or embedded in the component carrier structure.

In an embodiment, the cavity has a (vertical) depth of at least 10 μm, in particular of at least 15 μm. With such dimensions of the cavity, the component carrier may be rendered robust against shear forces tending to unintentionally separate the interconnected component carrier structures. For instance, the depth of the cavity may be less than 50 μm. A (horizontal) width of the cavity may be at least 20 μm, in particular at least 30 μm. Said width may be less than 80 μm.

In an embodiment, the surface profile has an average top to bottom distance of at least 2 μm, in particular of at least 4 μm. In particular, the term "average top to bottom distance" of the surface profile may denote an averaged vertical distance between a protrusion and a directly adjacent indentation of the surface profile. The top to bottom distance may be determined by averaging multiple values of said vertical distance of the surface profile along the cavity in a cross-sectional view of the component carrier. In particular, at least five, more particularly all, pairs of protrusions and adjacent indentations of the cavity may be taken into account for determining the average value. Descriptively speaking, such a surface profile may establish a pronounced mechanical interlocking between material of the respective contact element and material of the electrically conductive connection medium entering into tiny valleys of the surface profile.

In an embodiment, the surface profile has an average top to bottom distance of not more than 15 µm, in particular of not more than 10 µm, preferably not more than 8 µm or even not more than 6 µm. Such an upper limit of the hills and valleys of the surface profile ensures that a sufficiently large amount of electrically conductive connection medium may be present in the recess for establishing a low-ohmic and mechanically robust connection.

For instance, the surface profile may comprise individual values of the top to bottom distance of adjacent indentations and protrusions of the surface profile in a range from 2 µm to 8 µm, in particular in a range from 4 µm to 6 µm. More specifically, at least 80% of the individual values of the top to bottom distance of adjacent indentations and protrusions of the surface profile may be in a range from 2 µm to 8 µm, in particular in a range from 4 µm to 6 µm.

In an embodiment, the cavity has a substantially round shape. Advantageously, this may result in a suppression of stress concentration, since stress may be prevented from locally concentrating at sharp edges. A main advantage of a round shape is that stress can be uniformly distributed along the surface of the cavity. Moreover, a favorable interference energy, a sufficiently high contact surface, and a proper geometric stability may be ensured by a round cavity. Alternatively, the cavity may have a substantially rectangular shape, preferably with rounded corners. This may result in a proper encapsulation of the electrically conductive connection medium and excellent properties in terms of electric coupling and mechanical connection. Preferably, a rectangularly shaped cavity may be deeply anchored within the via.

Preferably, the cavity shape may be free of sharp edges. This may suppress stress concentration. The usage of round surfaces or rounded corners is thus preferred.

In an embodiment, a first recess is formed in the first contact element and a second recess is formed in the second contact element (being aligned with the first element) or in the component, and wherein both the first recess and the second recess are filled with the electrically conductive connection medium. When both contact elements are provided with recesses facing each other, a double-sided form closure between the electrically conductive connection medium and the component carrier structures or the component may be achieved. This may strengthen both the electric coupling and the mechanical connection between the component carrier structures and may strongly suppress any tendency of delamination, even in the event of shear forces. Furthermore, this may improve alignment of opposing contacts so as to maintain proper connections. Shear-stress induced slippage of vias and other structures may ensure correct interconnection to avoid stress concentration.

In an embodiment, the electrically conductive connection medium is a viscous deformable medium such as an electrically conductive paste, in particular a silver paste or a copper paste. More generally, the electrically conductive connection medium may be a shapeable or a pasty or a freely formable or even a semi-flowable material. A metallic paste, in particular including metallic particles and a solvent (which can be evaporated upon heating), is a good choice for the electrically conductive connection medium. This renders the electrically conductive connection medium capable of reliably (and preferably completely) filling the recess(es) including tiny gaps of the surface profile. It is also possible that the electrically conductive connection medium comprises an electrically conductive polymer.

In an embodiment, at least one of the first contact element and the second contact element contributes to an electrically conductive vertical through connection for vertically connecting the first component carrier structure and the second component carrier structure. For instance, such an electrically conductive vertical through connection may be an array of vertically stacked vias in one or both of the connected component carrier structures, the stacked vias being connected with the electrically conductive connection medium. Thus, a short-path electric connection may be created between the interconnected component carrier structures. This keeps signal losses small and ensures a compact design of the component carrier.

In an embodiment, the first contact element and/or the second con-tact element may be a via, more particularly a via with tapering sidewalls. For instance, such a via may be a copper filled laser via. Hence, the electrically conductive connection medium may form an electrically conductive bridge between two opposing vias as preferred embodiment for the interconnected contact elements of the component carrier structures.

In an embodiment, the component carrier comprises a dielectric sheet having at least one through hole filled with the electrically conductive connection medium, the dielectric sheet being arranged between the first component carrier structure and the second component carrier structure or the component. Each through hole may correspond to a respective pair of aligned contact elements of the component carrier structures or a component to be connected. The dielectric sheet may form a planar electrically insulating matrix for providing electrically conductive connection medium exactly where it is needed for creating an electrically conductive z-connection without forming unintentional electrically conductive paths elsewhere.

In an embodiment, the dielectric sheet comprises or consists of an adhesive material, in particular prepreg or resin. Correspondingly, the method may comprise providing the dielectric sheet with a curable material, and at least partially curing the curable material of the dielectric sheet upon connecting the first component carrier structure with the second component carrier structure with the dielectric sheet in between. When the dielectric material of the sheet is adhesive, it may adhere portions of the component carrier structures between the contact elements to be connected by the electrically conductive connection medium. When an uncured resin material (as present in prepreg material before curing) of the dielectric sheet is triggered to be cured by pressing together the component carrier structures with the dielectric sheet in between with or without an additional supply of thermal heat, curing the resin material may cause an adhesive connection between the component carrier structures by lamination. More generally, such a curing may be triggered by the application of mechanical pressure and/or the supply of thermal energy.

In an embodiment, the method comprises filling the electrically conductive connection medium into the at least one recess when, i.e. upon, connecting the first component carrier structure with the second component carrier structure or with the component. Thus, connecting the component carrier structures with each other (preferably by lamination using a curable dielectric sheet in between) and causing the preferably pasty electrically conductive connection medium to move into the one or recesses by applying mechanical pressure may allow to establish a reliable mechanical and electrical connection between the interconnected component carrier structures. Both the electric and the mechanical connection may be created simultaneously, i.e. in one common process, and thus in a quick and simple way.

In an embodiment, the method comprises providing the electrically conductive connection medium in at least one through hole of a dielectric sheet before connecting the first component carrier structure with the second component carrier structure or with the component with the dielectric sheet (having the electrically conductive connection medium) in between. Thus, preferably pasty electrically conductive connection medium may firstly be inserted (for instance dispensed) into pre-formed through holes of the dielectric sheet before sandwiching the metal paste-filled dielectric sheet between the component carrier structures to be connected electrically and mechanically.

In an embodiment, the method comprises forming the at least one through hole of the dielectric sheet by drilling, in particular by laser drilling. In particular laser drilling is a simple, reliable and precise way of defining the position of one or more through holes in the dielectric sheet in alignment with an array of pairs of contact elements to be electrically interconnected by electrically conductive connection medium in the one or more through holes. As an alternative to laser drilling, also mechanically drilling, punching and etching are possible for creating the through hole(s).

In an embodiment, the method comprises filling the electrically conductive connection medium in form of a paste (for instance copper paste or silver paste) in the at least one through hole of the dielectric sheet. Such a pasty electrically conductive filling medium may be deformable or shapeable so as to properly fill essentially the entire recess(es), including tiny gaps constituting the surface profile. As a filling medium, electrically conductive polymers can be used as well, as they are adhesive and electrically conductive.

In an embodiment, the method comprises forming the at least one recess by etching at least one of the first contact element at the first contact surface, and the second contact element at the second contact surface. Hence, cavity and surface profile may be created by etching. As an alternative to etching, drilling (in particular mechanically drilling or laser drilling) or grinding is possible as well. The recess is most preferably formed by etching, in order to achieve a high roughness of the surface, which promotes the adhesion between filling medium and via surface. However, it may also be possible to produce these recesses by drilling (laser and mechanically drilling) as well as grinding the via surface with a small grinding (and/or drilling) head. With the latter methods, the adhesion between filling medium and via surface may be advantageously pronounced, as also with these methods a roughened surface profile can be achieved. For instance, wet etching and/or plasma etching may be carried out for this purpose. Isotropic and/or anisotropic etching processes may be carried out as well. Advantageously, adjusting the etching parameters (such as etchant, additives, etching time, conditions such as etching temperature, etc.) may allow to adjust the shape and the dimensions of the cavity and the surface profile. For instance, a more aggressive etching strategy may result in a deeper recess and/or in steeper sidewalls of the recess.

In an embodiment, the method comprises covering part of the first contact surface and/or part of the second contact surface with an etch protection structure during etching. The etch protection structure may be a temporary etch protection structure which may be removed from the respective component carrier structure after etching. Descriptively speaking, such an etch protection structure may be a patterned mask (for instance a photomask) defining which surface portions of the contact elements of the component carrier structures to be interconnected shall be processed by etching, and which other surface portions shall be protected from the etching attack. In particular dielectric surface regions of the opposing contact surfaces may be prevented from etching. It is however also possible to partially cover a respective contact element (for instance to cover selectively an exterior ring portion thereof) with the etch protection structure so as to properly define dimensions and shape of the recess. As an alternative, a protection structure may be used protecting certain areas against drilling (in particular mechanically drilling or laser drilling) or grinding.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer, or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through holes through the laminate, for instance by laser drilling or mechanical drilling, and by filling them with electrically conductive material (in particular copper), thereby forming vias as through hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal, and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene-functionalized polymers.

In an embodiment, the respective at least one electrically insulating layer structure comprises at least one of the group consisting of resin (such as reinforced or non-reinforced resins, for instance epoxy resin or bismaleimide-triazine resin), cyanate ester resin, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Teflon is a registered mark of The Chemours Company FC LLC of Wilmington, Delaware, U.S.A. Reinforcing structures such as webs, fibers, or spheres, for example made of glass (multilayer glass) may be used as well. Although prepreg particularly FR4 are usually preferred for rigid PCBs, other materials in particular epoxy-based build-up film or photo-imageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the respective at least one electrically conductive layer structures comprises at least one of the group consisting of copper, aluminum, nickel, silver, gold, palladium, and tungsten. Although copper is usually preferred, other materials or coated versions thereof are possible as well, in particular materials coated with supraconductive material such as graphene.

At least one component, which can be embedded in the stack, can be selected from a group consisting of an electrically non-conductive inlay (such as a ceramic inlay, preferably comprising aluminum nitride or aluminum oxide), an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer, or a further component carrier, for example in a board-in-board configuration. The component may be surface mounted on the component carrier and/or may be embedded in an interior thereof. Moreover, also other components, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, Electroless Nickel Immersion Palladium Immersion Gold (ENIPIG), etc.

The aspects defined above and further aspects of the invention are apparent from the examples of embodiment to be described hereinafter and are explained with reference to these examples of embodiment.

BRIEF DESCRIPTION OF THE DRAWINGS

FIG. 4. FIG. 5, FIG. 6, FIG. 7 and FIG. 8 illustrate cross-sectional views of structures obtained during carrying out methods of manufacturing component carriers according to exemplary embodiments.

DETAILED DESCRIPTION OF ILLUSTRATED EMBODIMENTS

Figure 1:
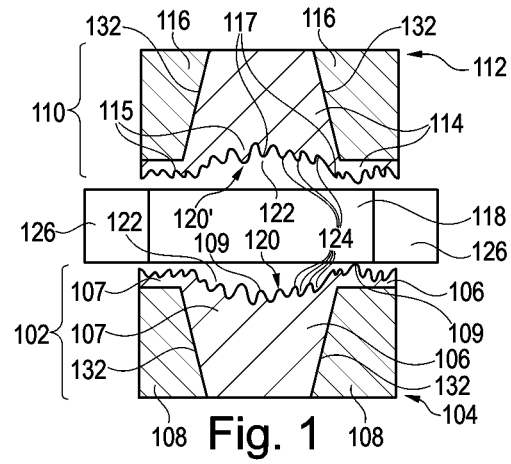
FIG. 1 illustrates a cross-sectional view of a structure obtained during carrying out a method of manufacturing a component carrier by connecting a component carrier structure with a further component carrier structure according to an exemplary embodiment.

The illustrations in the drawings are schematically presented. In different drawings, similar or identical elements are provided with the same reference signs.

Before referring to the drawings, exemplary embodiments will be described in further detail, some basic considerations will be summarized based on which exemplary embodiments of the invention have been developed.

According to an exemplary embodiment of the invention, at least one electrically conductive contact element at a contact surface of a component carrier structure which is to be electrically and mechanically connected with another component carrier structure may be configured as a rough dimple which can be filled partially or entirely with a preferably pasty electrically conductive connection medium for establishing a reliable z-interconnection between the component carrier structures. As a result, a component carrier, such as a printed circuit board (PCB), may be obtained which has a short-path and therefore low-loss and compact vertical electric connection while at the same time providing a reliable protection against an undesired delamination of the interconnected component carrier structures, in particular in the event of horizontal shear forces. The described interconnection technique may reduce internal stress in the component carrier and may convert shear stress into multidirectional stress while simultaneously ensuring a proper electrical performance.

Descriptively speaking, a prepreg sheet may be laser drilled for creating at least one through hole which can then be filled with metallic (for instance copper) paste or the like. One or both facing main surfaces of two or more component carrier structures (such as PCBs or laminated layers stacks) may be made subject to a selective etching process for defining one or more recesses in aligned electrically conductive contact elements of the component carrier structures to be connected. Preferably, such a respective recess may be defined by a concave cavity with—compared with dimensions of the cavity—smaller dimensioned surface profile structures formed on a wall delimiting the cavity. The prepreg sheet with the one or more sections filled with the metallic paste may then be sandwiched between the component carrier structures so that the one or more recesses are aligned with the one or more sections of metallic paste, which is thereby pressed into the recess(es). The component carrier structures and the dielectric sheet in between may then be interconnected by lamination, i.e. by mechanical pressure, preferably accompanied by an elevated temperature. As a result, a component carrier (for instance a PCB) may be obtained with short vertical electrical connections and a reliable mechanical integrity.

A main challenge when developing a z-interconnection in a component carrier is to overcome delamination (i.e. separation in the interface between interconnected component carrier structures or substructures) and slipping vias. In particular these two defects are considered to occur mainly due to a poor surface adhesion between a metallic paste and a board-to-via surface especially when a stress level is high.

To overcome these and/or other issues, an exemplary embodiment of the invention is creating a rough dimple or an uneven cavity on the via pad(s) to be interconnected in order to ensure a high surface adhesion and a mechanical obstacle for high stability. For example, the creation of such a rough dimple can be executed by a photolithographic process by which an entire board or other component carrier structure is covered by a photoresist, while only one or more z-interconnection pads or other contact elements remain uncovered. Once the photolithographic process is completed, the component carrier structure may proceed to an etching process (or another alternative such as a bond process) in order to etch part of the contact element(s) to thereby create a rough surface profile in a cavity. A preferred result of such a process may be a rounded rough dimple shape or a rectangular or trapezoid cavity that may properly hold metallic paste (or another electrically conductive connection medium) after pressing. For said roughening, any desired etching process may be correspondingly adapted. It is however also possible to use other adhesion promotors, such as a bond process, etc. Also, a mechanical treatment (for instance by drilling, in particular mechanically drilling or laser drilling, or by grinding) of the contact elements may be carried out for creating the recess(es).

For instance, embodiments of the invention are particularly appropriate for large-dimension component carriers, such as those used for space applications. Exemplary embodiments of the invention may provide component carriers with high reliability and being manufacturable with high yield.

Figure 1A:
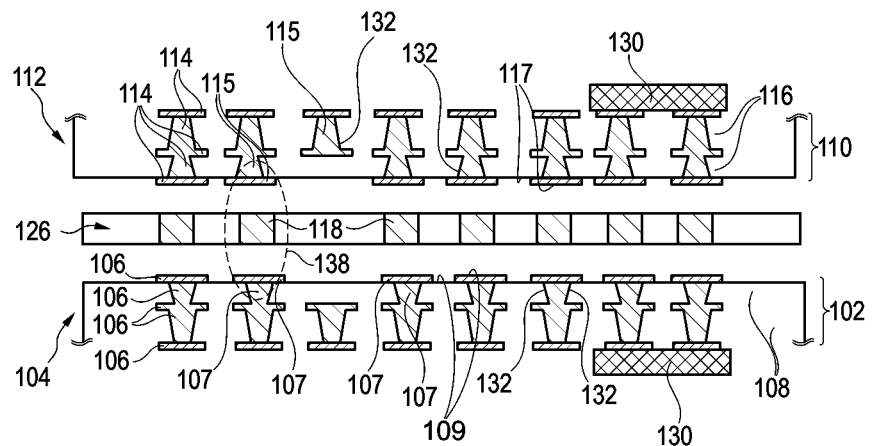
FIG. 1A illustrates a cross-sectional view of larger portions of component carrier structures of the structure according to FIG. 1.

FIG. 1 illustrates a cross-sectional view of a structure obtained during carrying out a method of manufacturing a component carrier 100 (shown in FIG. 2) according to an exemplary embodiment. FIG. 1A illustrates a cross-sectional view of larger portions of component carrier structures 104, 112 of the structure according to FIG. 1. In other words, FIG. 1 illustrates substantially a detail 138 of FIG. 1A. More specifically, FIG. 1A illustrates two sub-boards, laminated layers stacks or even printed circuit board (PCBs) to be interconnected for obtaining a highly reliable high-performance vertical electric coupling and simultaneously a strong mechanical connection in the horizontal plane without a risk of delamination. FIG. 1 illustrates details of approximately a portion 138 of what is shown in FIG. 1A.

As a basis for the described manufacturing process, a first component carrier structure 104 is shown in FIG. 1 and FIG. 1A, comprising a first laminated layer stack 102. The latter is composed of a plurality of first electrically conductive layer structures 106 and a plurality of first electrically insulating layer structure 108. The first electrically conductive layer structures 106 have a plurality of first contact elements 107 which extend up to a first contact surface 109 of the first stack 102. When a component 130, such as a semiconductor chip, is embedded in the first stack 102, the first component carrier structure 104 has an extended functionality. However, the first component carrier structure 104 with embedded component 130 may then be more prone to internal stress (for instance thermal stress), which may cause undesired phenomena such as delamination and/or warpage. In particular, delamination may however be strongly suppressed by the interconnection technique according to an exemplary embodiment of the invention, as described below in further detail.

Furthermore, an additional basis for the described manufacturing process is a second component carrier structure 112 which comprises a second laminated layer stack 110 comprising a plurality of second electrically conductive layer structures 114 and a plurality of second electrically insulating layer structures 116. Said second electrically conductive layer structures 114 have second contact elements 115 which extend up to a second contact surface 117 of the second stack 110. In the shown embodiment, each of the contact elements 107, 115 has a copper filled laser via with tapering sidewalls 132. Later during the manufacturing process, the component carrier structures 104, 112 are to be interconnected at their facing contact surfaces 109, 117. Optionally, a further component 130, such as a semiconductor chip, may be embedded in the second stack 110 which may result in the above-described advantages, in terms of extended functionality, and avoidance or reduction of issues in terms of delamination, warpage, etc.

In particular, each of the first component carrier structure 104 on a bottom side and the second component carrier structure 112 on a top side may be embodied as an IC (integrated circuit) substrate or as a printed circuit board (PCB). Thus, the first component carrier structure 104 may be a plate-shaped laminate type layer stack 102, and the second component carrier structure 112 may be another plate-shaped laminate type layer stack 110. For example, the respective electrically conductive layer structures 106, 114 may comprise patterned copper structures and vertical through connections, for example copper filled laser vias. The electrically insulating layer structures 108, 116 may comprise a resin (such as epoxy resin) and optionally reinforcing particles therein (for instance glass fibers or glass spheres). For instance, the electrically insulating layer structures 108, 116 may be made of FR4 or ABF.

As best seen in FIG. 1A, a planar dielectric sheet 126 may be arranged between the still separate component carrier structures 104, 112. The dielectric sheet 126 may be embodied for example to comprise or consist of a curable material, such as an uncured epoxy resin. For instance, reinforcing particles such as glass fibers may be integrated in the resin matrix. For instance, the dielectric sheet 126 may be an epoxy resin sheet or a prepreg sheet. The described configuration of the dielectric sheet 126 makes it possible that the dielectric sheet 126 becomes flowable and adhesive when being mechanically pressed between component carrier structures 104, 112, preferably accompanied by a supply of thermal energy. Thus, mechanical pressure and/or elevated temperature may trigger curing of the previously uncured resin material of the dielectric sheet 126 so that the resin at least partially cures to thereby cause adhesion between the component carrier structures 104, 112.

As shown in FIG. 1A, a plurality of through holes may be formed in the dielectric sheet 126. This may be accomplished for example by drilling, in particular by laser drilling. As a result, a perforated dielectric sheet 126 may be obtained. After said perforation, an electrically conductive connection medium 118 may be inserted (for instance printed or dispensed) in each of the drilled through holes of the dielectric sheet 126, still before connecting the first component carrier structure 104 with the second component carrier structure 112 with the dielectric sheet 126 having the electrically conductive connection medium 118 in between. Preferably, such an electrically conductive connection medium 118 may be freely formable, highly viscous or even semi-flowable, so as to reliably remain inside of the through holes without dropping out of the through holes. However, the electrically conductive connection medium 118 may at the same time be sufficiently deformable so as to be reliably pressable into recesses 120, 120' formed in the contact surfaces 109, 117 and shown in FIG. 1, as described below. Preferably, the electrically conductive connection medium 118 is an electrically conductive paste, such as a copper paste or a silver paste.

Referring again to FIG. 1, a respective recess 120 may be formed in each of the exposed first contact elements 107. As shown in FIG. 1, such a recess 120 comprises a larger dimensioned cavity 122 delimited by a smaller dimensioned surface profile 124. Correspondingly, a respective recess 120' may be formed in each of the exposed second contact elements 115. Also, recesses 120' may comprise a larger dimensioned cavity 122 delimited by a smaller dimensioned surface profile 124 on a wall delimiting cavity 122. Recesses 120, 120' may be formed by etching the contact elements 107, 115, wherein an adjustment of the etching parameters and conditions allows defining geometric parameters, shape and dimensions of the cavities 122 and the surface profiles 124. As a result of such a controlled etching process, the vias with rough dimple, as shown in FIG. 1, may be obtained.

As shown in FIG. 1 and FIG. 1A as well, the component carrier structures 104, 112 and the dielectric sheet 126 with the electrically conductive connection medium 118 in its through holes may be positioned relative to each other in such a way that each reservoir of electrically conductive connection medium 118 in dielectric sheet 126 is aligned with and is arranged between two respectively aligned contact elements 107, 115 of the component carrier structures 104, 112 prior to their interconnection.

Figure 2:
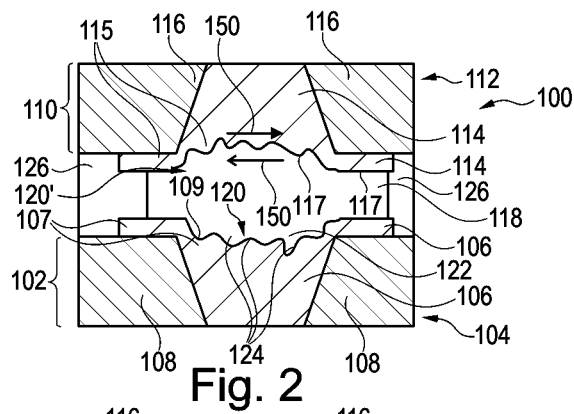
FIG. 2 illustrates a cross-sectional view of a component carrier according to an exemplary embodiment.

FIG. 2 illustrates a cross-sectional view of a component carrier 100 according to an exemplary embodiment.

In order to obtain the component carrier 100 shown in FIG. 2, the first contact elements 107 at the first contact surface 109 may be connected with the second contact elements 115 at the second contact surface 117 by filling the electrically conductive connection medium 118 into the recesses 120, 120'. This may be achieved by connecting the first component carrier structure 104 with the second component carrier structure 112 with the dielectric sheet 126 with its reservoirs of electrically conductive contact medium 118 in between. This process may involve mechanically pressing the component carrier structures 104, 112 and the dielectric sheet 126 together. Advantageously, this pressing process may be accompanied by thermal energy. During this pressing process, the deformable viscous pasty electrically conductive connection medium 118 may be pressed into the recesses 120, 120'. Simultaneously, the pressing and supply of thermal energy will trigger curing (for instance by becoming flowable, cross-linking, and re-solidifying) of the curable resin material of the dielectric sheet 126 upon establishing the press connection between the first component carrier structure 104 and the second component carrier structure 112 with the dielectric sheet 126 in between. Consequently, the cured epoxy resin (or another appropriate curable material) will adhesively connect the component carrier structures 104, 112 mechanically, apart from the regions in which the electric connection is established by the electrically conductive connection medium 118.

As a result of the described manufacturing process, the component carrier 100 shown partially in FIG. 2 can be obtained. This component carrier 100 comprises the first component carrier structure 104 with its first stack 102 as described above, the second component carrier structure 112 comprising its second stack 110 as described above, and the above described dielectric sheet 126 with its through holes 128 filled with the electrically conductive connection medium 118 in between the interconnected component carrier structures 104, 112.

More specifically, each of the various islands of electrically conductive connection medium 118 directly connects a respective one of the first contact elements 107 at the first contact surface 109 with a respective one of the second contact elements 115 at the second contact surface 117 by filling the assigned recesses 120, 120' of said first contact elements 107 and said second contact elements 115. As described above, each of the recesses 120, 120' comprises a larger dimensioned cavity 122 delimited by a smaller dimensioned surface profile 124.

In the embodiment of FIG. 2, the cavity 122 has a round shape, such as a substantially circular shape. Advantageously, this may result in a favorable interference energy, a sufficiently large contact surface, and a proper geometric stability.

The direct electrically conductive path established by a respective first contact element 107, a respective second contact element 115, and an island of electrically conductive connection medium 118 in between contributes to an electrically conductive vertical through connection for vertically connecting the first component carrier structure 104 and the second component carrier structure 112 with a short path. This keeps the loss of electric signals propagating along said path small, and allows manufacturing a component carrier 100 with small space consumption. Even in the presence of high internal stress (for instance caused by inhomogeneous thermal expansion within the component carrier 100, in view of the different coefficients of thermal expansion of semiconductor material of embedded components 130 and copper and resin material of stacks 102, 110), the illustrated component carrier 100 does not show a pronounced tendency of delamination or warpage. Furthermore, shear forces (indicated schematically in FIG. 2 by arrows 150) acting in a horizontal direction are inhibited or even disabled from delaminating component carrier 100 in view of the form closure between the electrically conductive connection medium 118 and the stacks 102, 110 thanks to the described geometry of the recesses 120, 120'.

Figure 3:
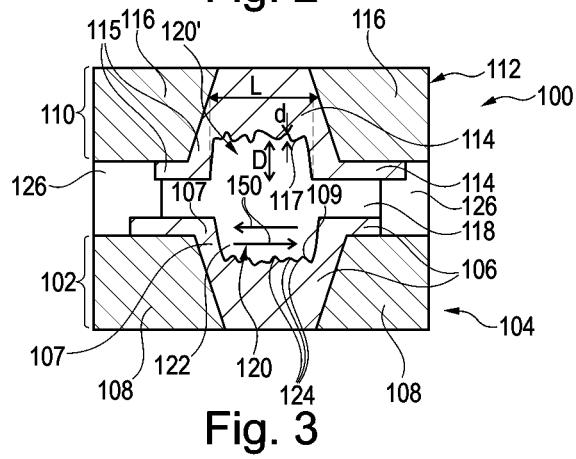
FIG. 3 illustrates a cross-sectional view of a component carrier according to another exemplary embodiment.

FIG. 3 illustrates a cross-sectional view of a component carrier 100 according to another exemplary embodiment.

According to FIG. 3, the cavity 122 has a substantially rectangular shape, resulting in a proper encapsulation of the electrically conductive connection medium 118. A proper geometric stability and a high contact surface may be achieved by this shape.

Still referring to a FIG. 3, each of the cavities 122 may have a depth, D, of for instance 15 µm and a width, L, of for instance 30 µm. This may result in a pronounced form closure between the electrically conductive connection medium 118 in the cavities 122 and the stacks 104, 110, which may significantly suppress undesired delamination even in the event of shear forces 150. Furthermore, the surface profile 124 has an average top to bottom distance, d, of for instance 5 µm. For determining the average top to bottom distance, the vertical distance between a protrusion and an adjacent indentation of the surface profile 124 shall be averaged over at least five, in particular over all, protrusions and directly adjacent indentations constituting the surface profile 124 along the extension of the cavity 122 in the cross-section of the component carrier 100 according to FIG. 3. Consequently, a mechanical interlocking between material of the contact elements 107, 115 forming protrusions delimiting the surface profile 124 of the recesses 120, 120' on the one hand and metal paste-filled indentations of the surface profile 124 may provide an additional protection against delamination. The synergetic combination of the advantageous effects of the large-dimensioned cavities 122 and the smaller-dimensioned surface profile 124 may result in a significant improvement of connection strength.

FIG. 4 to FIG. 8 illustrate cross-sectional views of structures obtained during carrying out methods of manufacturing component carriers 100 according to exemplary embodiments.

Referring to FIG. 4, first stack 102 of first component carrier structure 104 described in detail referring to FIG. 1 and FIG. 1A is shown before formation of recess 120. In order to obtain the structure shown in FIG. 4, the upper main surface of the first stack 102 is covered by a layer of photoresist, as etch protection structure 134. Thereafter, the photoresist may be patterned, for instance by lithography and etching. As a result, only part of the first contact surface 109 (and part of the second contact surface 117) remains covered with etch protection structure 134, which is embodied as patterned layer of photoresist.

Referring to FIG. 5, a round recess 120 is formed in the exposed window of the etch protection structure 134 by etching an exposed surface portion of the first contact element 107 at the first contact surface 109.

In order to obtain the structure shown in FIG. 6, the etch protection structure 134 is removed from the first stack 102 after etching, for instance by stripping or a further etching procedure.

The structures shown in FIG. 7 and FIG. 8 can be manufactured in a corresponding way as the structures shown in FIG. 4 to FIG. 6 with the difference that a rectangular (rather than a round) recess 120 is formed according to FIG. 7 and FIG. 8. The different geometry of the round recess 120 according to FIG. 6 and the rectangular recess 120 according to FIG. 8 results from different etching parameters. The etching process according to FIG. 7 and FIG. 8 is more aggressive and shows another level of anisotropy as compared to the etching process according to FIG. 4 to FIG. 6. For instance, wet etching and/or plasma etching may be used, alone or in combination. Etchant composition, etchant additives and/or etching time are examples for parameters which can be modified for adjusting the properties of the cavity 122 and the surface profile 124.

Figure 9:
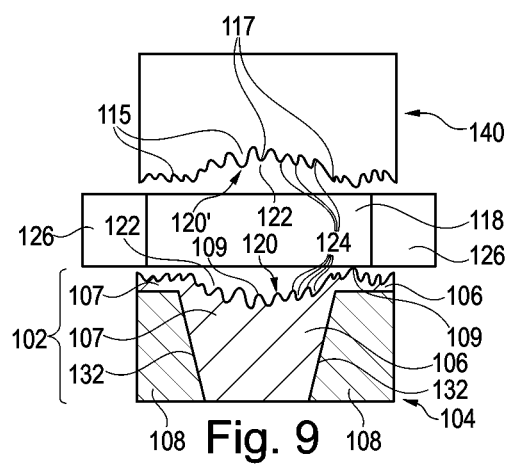
FIG. 9 illustrates a cross-sectional view of a structure obtained during carrying out a method of manufacturing a component carrier by connecting a component carrier structure with a component according to an exemplary embodiment.

FIG. 9 illustrates a cross-sectional view of a structure obtained during carrying out a method of manufacturing a component carrier 100 by connecting a component carrier structure 104 with a component 140 according to an exemplary embodiment. Substantially, the embodiment of FIG. 9 differs from the embodiment of FIG. 1 in that a recessed component 140 rather than a second component carrier structure 112 is connected with first component carrier structure 104. For instance, component 140 may be a heat sink or a semiconductor chip.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
   a first component carrier structure comprising a first stack which comprises at least one first electrically conductive layer structure and at least one first electrically insulating layer structure, wherein the at least one first electrically conductive layer structure has a first contact element which extends to a first contact surface of the first stack;
   an electrically conductive connection medium filled into through holes of a dielectric sheet directly connected to the first contact element at the first contact surface by filling at least one recess of the first contact element, the at least one recess comprising a larger dimensioned cavity delimited by a smaller dimensioned surface profile traversing the at least one recess of the first contact element across the through hole; and
   a second component carrier structure comprising a second stack which comprises at least one second electrically conductive layer structure and at least one second electrically insulating layer structure, wherein the at least one second electrically conductive layer structure has a second contact element which extends to a respective contact surface of the second stack;
   wherein the electrically conductive connection medium in the through holes of the dielectric sheet connects the first contact element at the first contact surface with the second contact element at the respective contact surface of the second stack;
   wherein the at least one recess of the first contact element is aligned with at least one recess of the second contact element, the at least one recess of the second contact element comprising a respective larger dimensioned cavity delimited by a respective smaller dimensioned surface profile traversing the at least one recess of the second contact element across the through hole,
   wherein the at least one recess of the first contact element and the at least one recess of the second contact element confine the electrically conductive connection medium such that the first contact element and the second contact element connect the first contact surface of the first stack with the second contact surface of the second stack with the electrically conductive medium at least partially therebetween.

2. The component carrier according to claim 1, further comprising:
   a component connected to the first contact element.

3. The component carrier according to claim 1, comprising at least one of the following features:
   wherein the larger dimensioned cavity has a depth of at least 10 µm;
   wherein the larger dimensioned cavity has a width of at least 20 µm;
   wherein the surface profile has an average top to bottom distance of at least 2 µm;
   wherein the surface profile has an average top to bottom distance of not more than 15 µm.

4. The component carrier according to claim 1, comprising at least one of the following features:
   wherein the larger dimensioned cavity has a round shape;
   wherein the larger dimensioned cavity has rounded corners.

5. The component carrier according to claim 2, wherein the electrically conductive connection medium in the through holes of the dielectric sheet connects the first contact element at the first contact surface with the second contact element at the respective contact surface of the second stack by filling at least one recess of the second contact element.

6. The component carrier according to claim 1, wherein the electrically conductive connection medium comprises a viscous deformable medium.

7. The component carrier according to claim 1, wherein the electrically conductive connection medium comprises an electrically conductive polymer.

8. The component carrier according to claim 1, wherein at least one of the first contact element and the second contact element contributes to an electrically conductive vertical through connection for vertically electrically connecting the first component carrier structure and the second component carrier structure.

9. The component carrier according to claim 1, wherein at least one of the first contact element and the second contact element comprises a via with tapering sidewalls.

10. The component carrier according to claim 1, wherein the dielectric sheet comprises an adhesive material.

11. A method of manufacturing a component carrier, the method comprising:
    forming a first component carrier structure comprising a first stack which comprises at least one first electrically conductive layer structure and at least one first electrically insulating layer structure, wherein the at least one first electrically conductive layer structure has a first contact element which extends up to a first contact surface of the first stack;
    filling at least one recess of the first contact element with an electrically conductive medium by filling through holes of a dielectric sheet directly connected to the first contact element at the first contact surface, the at least one recess comprising a larger dimensioned cavity delimited by a smaller dimensioned surface profile traversing a via;
    forming a second component carrier structure comprising a second stack which comprises at least one second electrically conductive layer structure and at least one second electrically insulating layer structure, wherein the at least one second electrically conductive layer structure has a second contact element which extends to a respective contact surface of the second stack; and
    connecting the first contact element at the first contact surface with the second contact element at the second contact surface by filling the at least one recess of the first contact element and optionally of the second contact element with the electrically conductive connection medium;

wherein the at least one recess of the first contact element is aligned with at least one recess of the second contact element, the at least one recess of the second contact element comprising a respective larger dimensioned cavity delimited by a respective smaller dimensioned surface profile traversing the at least one recess of the second contact element across the through hole, wherein the at least one recess of the first contact element and the at least one recess of the second contact element confine the electrically conductive connection medium such that the first contact element and the second contact element connect the first contact surface of the first stack with the second contact surface of the second stack with the electrically conductive medium at least partially therebetween.

12. The method according to claim 11, the method further comprising:

providing a component; and connecting the first contact element at the first contact surface with the component.

13. The method according to claim 11, wherein the method comprises filling the electrically conductive connection medium into the at least one recess of the first contact element when connecting the first component carrier structure with the second component carrier structure.

14. The method according to claim 11, comprising at least one of the following features:

wherein the method comprises providing the dielectric sheet with a curable material, and at least partially curing the curable material of the dielectric sheet upon connecting the first component carrier structure with the second component carrier structure with the dielectric sheet in between;

wherein the method comprises forming the at least one through hole of the dielectric sheet by one of the group consisting of drilling, punching, and etching;

wherein the method comprises filling the electrically conductive connection medium in form of a paste in the at least one through hole of the dielectric sheet.

15. The method according to claim 11, wherein the method comprises forming the at least one recess by etching, drilling, or grinding at least one of the first contact element at the first contact surface, and the second contact element at the respective contact surface.

16. The method according to claim 15, wherein the method comprises covering at least one of part of the first contact surface, and part of the second contact surface with a protection structure during etching, drilling, or grinding.

* * * * *